United States Patent
Ogawa

(10) Patent No.: US 9,059,237 B2
(45) Date of Patent: Jun. 16, 2015

(54) SEMICONDUCTOR DEVICE HAVING AN INSULATED GATE BIPOLAR TRANSISTOR

(71) Applicant: Sanken Electric Co., LTD., Niiza-shi, Saitama (JP)

(72) Inventor: Kazuko Ogawa, Niiza (JP)

(73) Assignee: Sanken Electric Co., LTD., Niiza-shi, Saitama (JP)

(*) Notice: Subject to any disclaimer, the term of this patent is extended or adjusted under 35 U.S.C. 154(b) by 0 days.

(21) Appl. No.: 14/036,637

(22) Filed: Sep. 25, 2013

(65) Prior Publication Data
US 2014/0225155 A1 Aug. 14, 2014

(30) Foreign Application Priority Data
Feb. 12, 2013 (JP) .................................. 2013-024130

(51) Int. Cl.
H01L 29/739 (2006.01)
H01L 29/66 (2006.01)

(52) U.S. Cl.
CPC ...... *H01L 29/7397* (2013.01); *H01L 29/66348* (2013.01)

(58) Field of Classification Search
CPC ....................... H01L 27/7397; H01L 29/66348
See application file for complete search history.

(56) References Cited

U.S. PATENT DOCUMENTS

| | | | |
|---|---|---|---|
| 5,770,878 A | 6/1998 | Beasom | |
| 5,894,149 A * | 4/1999 | Uenishi et al. | 257/331 |
| 6,380,586 B1 | 4/2002 | Yoshikawa | |
| 6,413,822 B2 | 7/2002 | Williams et al. | |
| 6,781,199 B2 | 8/2004 | Takahashi | |
| 2002/0019099 A1 | 2/2002 | Williams et al. | |
| 2002/0153558 A1* | 10/2002 | Takemori et al. | 257/330 |
| 2002/0179976 A1 | 12/2002 | Takahashi | |
| 2003/0003637 A1 | 1/2003 | Ninomiya | |
| 2013/0001681 A1 | 1/2013 | Sin et al. | |

FOREIGN PATENT DOCUMENTS

| | | |
|---|---|---|
| JP | H05007002 A | 1/1993 |
| JP | H10032335 A | 2/1998 |

(Continued)

OTHER PUBLICATIONS

Japanese Office Action issued Jan. 21, 2014 in corresponding Japanese Application No. 2013-024130.

(Continued)

*Primary Examiner* — William Coleman
(74) *Attorney, Agent, or Firm* — Banner & Witcoff, Ltd.

(57) ABSTRACT

A semiconductor device includes: a first semiconductor region; a second semiconductor region, which is arranged on the first semiconductor region; a third semiconductor region, which is arranged on the second semiconductor region; a plurality of fourth semiconductor regions, each of which is arranged with being spaced from each other on the third semiconductor region; a insulation film arranged on a inner wall of a recess, which extends from upper faces of the fourth semiconductor region to pass through the third semiconductor region and the fourth semiconductor region and reaches the second semiconductor region; a control electrode, a first main electrode, a second main electrode, which is electrically connected to the third semiconductor region and the fourth semiconductor region, wherein a ratio of a width of the recess to a width of the third semiconductor region abutting on the second main electrode is 1 or more.

14 Claims, 15 Drawing Sheets

(56) References Cited

FOREIGN PATENT DOCUMENTS

| | | |
|---|---|---|
| JP | 2000228519 A | 8/2000 |
| JP | 2001332728 A | 11/2001 |
| JP | 2002270842 A | 9/2002 |
| JP | 2002-353456 A | 12/2002 |
| JP | 2002543587 A | 12/2002 |
| JP | 2003017699 A | 1/2003 |
| JP | 2007115943 A | 5/2007 |
| JP | 2009224470 A | 10/2009 |
| JP | 2013-524481 A | 6/2013 |
| WO | 00/65646 A1 | 11/2000 |

OTHER PUBLICATIONS

Japanese Office Action issued Mar. 10, 2015 in Japanese Application No. 2013-024130.

* cited by examiner

SEMICONDUCTOR DEVICE HAVING AN INSULATED GATE BIPOLAR TRANSISTOR

CROSS-REFERENCE TO RELATED APPLICATION

This application claims priority from Japanese Patent Application No. 2013-024130 filed on Feb. 12, 2013, the entire subject matter of which is incorporated herein by reference.

TECHNICAL FIELD

This disclosure relates to a semiconductor device having an insulated gate bipolar transistor (IGBT) structure Since an insulated gate bipolar transistor (IGBT) has a high input impedance and a low on-voltage, it, is used for a motor driving circuit and the like. However, the IGBT has a tradeoff relation between a withstand voltage and an on-voltage.

Therefore, a variety of methods is proposed to lower the on-voltage while keeping the withstand voltage high. For example, a structure has been suggested in which an n-type layer (hereinafter, referred to as a 'carrier accumulation layer') having holes accumulated therein in a higher impurity concentration than in a drift region is formed between a base region and a collector region. According to this structure, the holes from the collector region are suppressed from reaching an emitter electrode, so that it is possible to lower an on-voltage (for example, refer to JP-A-2002-353456).

SUMMARY

However, in order to realize a semiconductor device having the carrier accumulation layer, a process for forming the carrier accumulation layer is required, so that the number of manufacturing processes of the semiconductor device is increased. Also, according to the method where the carrier accumulation layer having the higher impurity concentration than the drift region is arranged in the semiconductor device, a depletion layer is difficult to favorably spread, so that it is not possible to sufficiently resolve the tradeoff of the withstand voltage and the on-voltage.

This disclosure provides at least a semiconductor device having high withstand voltage and low on-voltage and capable of suppressing an increase in the number of manufacturing processes.

In one aspect of this disclosure, a semiconductor device comprises: a first semiconductor region, which has a first conductivity type; a second semiconductor region, which has a second conductivity type and is arranged on the first semiconductor region; a third semiconductor region, which has the first conductivity type and is arranged on the second semiconductor region; a plurality of fourth semiconductor regions, each of which has the second conductivity type and is arranged with being spaced from each other on the third semiconductor region; a insulation film arranged on a inner wall of a recess, which extends from upper faces of the fourth semiconductor region to pass through the third semiconductor region and the fourth semiconductor region and reaches the second semiconductor region, wherein the insulation film faces a side face of the third semiconductor region; a control electrode, which is arranged on the insulation films in the recess; a first main electrode, which is electrically connected to the first semiconductor region; and a second main electrode, which is electrically connected to the third semiconductor region and the fourth semiconductor region, wherein a ratio of a width of the recess to a width of the third semiconductor region abutting on the second main electrode is 1 or more.

In another aspect of this disclosure, a semiconductor device comprises: a first semiconductor region, which has a first conductivity type; a second semiconductor region, which has a second conductivity type and is arranged on the first semiconductor region; a third semiconductor region, which has the first conductivity type and is arranged on the second semiconductor region; a plurality of fourth semiconductor regions, each of which has the second conductivity type and is arranged with being spaced from each other on the third semiconductor region; a insulation film arranged on a inner wall of a recess, which extends from upper faces of the fourth semiconductor region to pass through the third semiconductor region and the fourth semiconductor region and reaches the second semiconductor region, wherein the insulation film faces a side face of the third semiconductor region; a control electrode, which is arranged on the insulation films in the recess; a first main electrode, which is electrically connected to the first semiconductor region; and a second main electrode, which is electrically connected to the third semiconductor region and the fourth semiconductor region, wherein a ratio of a total area of the recess in the same plane level as an interface between the second semiconductor region and the third semiconductor region to a total area of a part of the third semiconductor region abutting on the second main electrode is 1 or more.

According to this disclosure, it is possible to provide a semiconductor device having high withstand voltage and low on-voltage and capable of suppressing an increase in the number of manufacturing processes.

BRIEF DESCRIPTION OF THE DRAWINGS

The foregoing and additional features and characteristics of this disclosure will become more apparent from the following detailed descriptions considered with the reference to the accompanying drawings, wherein:

FIG. 3 illustrates a simulation result illustrating an aspect that holes are accumulated in the semiconductor device, where

FIG. 4 illustrates a simulation result of a potential distribution in the vicinity of the recess, where

DETAILED DESCRIPTION

Figure 1:
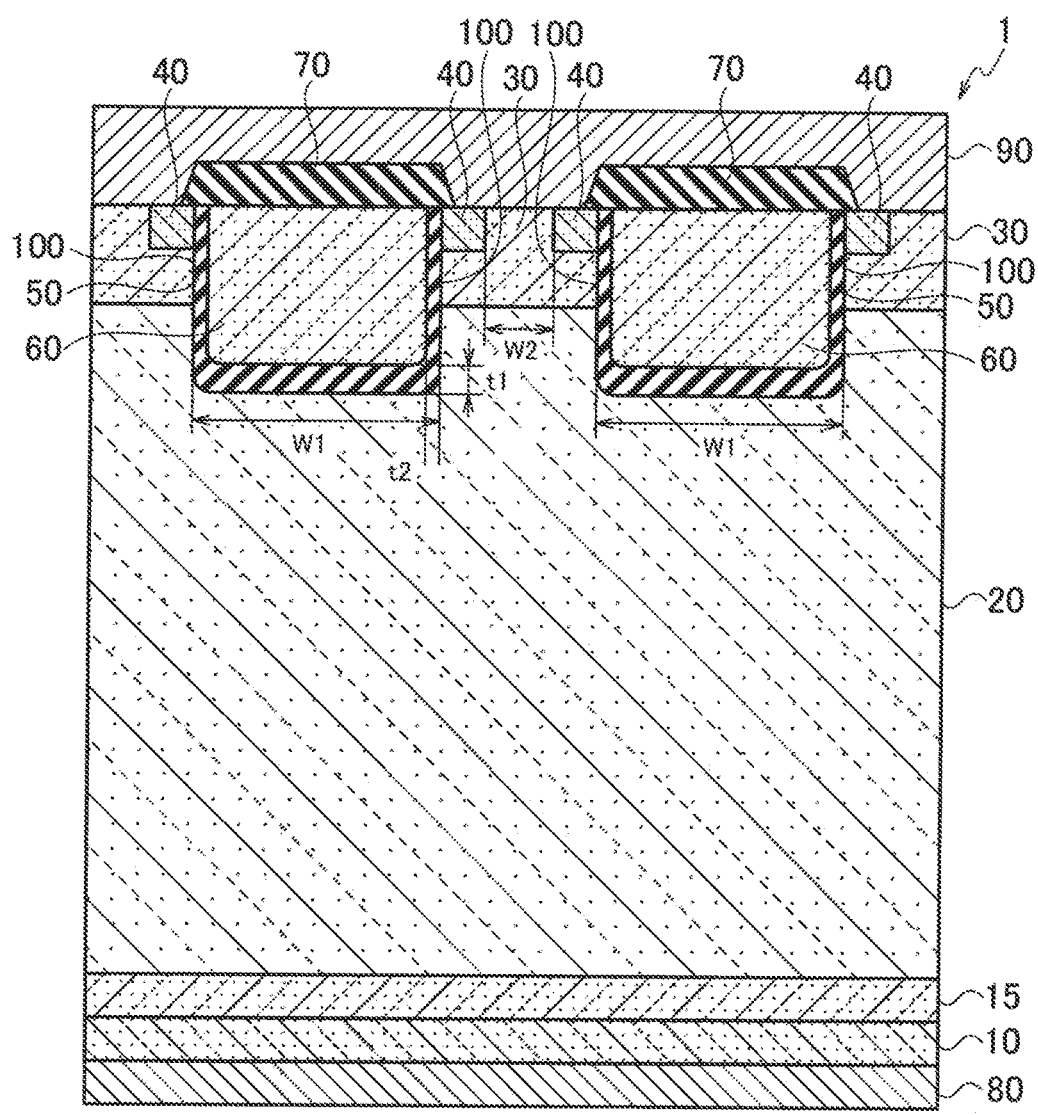
FIG. 1 is a schematic sectional view illustrating a structure of a semiconductor device according to an illustrative embodiment of this disclosure.

Hereinafter, illustrative embodiments of this disclosure will be described with reference to the accompanying drawings. In the drawings, the same or similar parts are denoted with the same or similar reference numerals. It should be noted that the figures are just schematic and a relation between a thickness and a planar size, a ratio of lengths of respective parts and the like may be different from the actual case. Therefore, the specific sizes should be determined in consideration with the below descriptions. Also, the size relation and ratio of the parts may be different in the respective drawings.

Also, the following illustrative embodiments exemplify a device and method for implementing the technical spirit of this disclosure, and thus shapes, structures, arrangements and the like of the constitutional parts are not specified to the below descriptions. The illustrative embodiments of this disclosure can be variously changed within the scope of the disclosure.

As shown in FIG. 1, a semiconductor device 1 according to an illustrative embodiment of this disclosure has a first semiconductor region 10 having a first conductivity type, a second semiconductor region 20 having a second conductivity type arranged on the first semiconductor region 10, a third semiconductor region 30 having the first conductivity type and arranged on the second semiconductor region 20, fourth semiconductor regions 40 having the second conductivity type arranged with being spaced from each other on the third semiconductor region 30, insulation films 50, control electrodes 60, a first main electrode 80, second main electrode 90. The insulation films 50 arranged on inner walls of recesses, which extend from upper faces of the fourth semiconductor regions 40 to pass through the fourth semiconductor regions 40 and the third semiconductor region 30 and reach the second semiconductor region 20 and facing bottoms of the recesses and side faces of the third semiconductor region 30. The control electrodes 60 arranged on the insulation films 50 in the recesses. The a first main electrode 80 electrically connected to the first semiconductor region 10 and the second main electrode 90 electrically connected to the third semiconductor region 30 and the fourth semiconductor regions 40. In the semiconductor 1, an interval W2 between the recesses in which the control electrodes 60 are formed is equal to or less than a width W1 of the recess.

In the meantime, the recess width W1 indicates a recess width at a part abutting on a lower face of the third semiconductor region 30, i.e., at a position of an interface between the third semiconductor region 30 and the second semiconductor region 20, and the interval W2 of the recesses indicates a width (creeping distance) of a part of the third semiconductor region 30 abutting on the second main electrode 90. The first conductivity type and the second conductivity type are opposite conductivity types. That is, when the first conductivity type is an n-type, the second conductivity type is a p-type and when the first conductivity type is a p-type, the second conductivity type is an n-type. In the below, a case where the first conductivity type is a p-type and the second conductivity type is an n-type is exemplarily described.

The semiconductor device 1 of the illustrative embodiment shown in FIG. 1 is an insulated gate bipolar transistor (IGBT). In the below, in order to easily understand the descriptions, it will be described that the first semiconductor region 10 is a p-type collector region 10, the second semiconductor region 20 is an n-type drift region 20, the third semiconductor region 30 is a p-type base region 30 and the fourth semiconductor region 40 is an n-type emitter region 40. The plurality of emitter regions 40 is selectively embedded in a part of an upper face of the base region. Also, it will be described that the control electrode 60 is a gate electrode 60, the first main electrode 80 is a collector electrode 80 and the second main electrode 90 is an emitter electrode 90. A face of the base region 30 facing the gate electrode 60 is a channel region 100. A region of the insulation film 50 formed on the side face of the recess functions as a gate insulation film.

In the meantime, an interlayer insulation film 70 is arranged on an upper face of the gate electrode 60. The emitter electrode 90 that is connected to the base region 30 and the emitter region 40 is arranged above the gate electrode 60 with the interlayer insulation film 70 being interposed therebetween. The gate electrode 60 and the emitter electrode 90 are electrically insulated from each other by the interlayer insulation film 70.

Also, in the embodiment shown in FIG. 1, fin n-type buffer layer 15 is arranged between the drift region 20 and the collector region 10.

First, operations of the semiconductor device 1 are described. A predetermined collector voltage is applied between the emitter electrode 90 and the collector electrode 80, and a predetermined gate voltage is applied between the emitter electrode 90 and the gate electrodes 60. For example, the collector voltage is about 300V to 1,600V and the gate voltage is about 10V to 20V. As a result, when the semiconductor device 1 is made to be an on-state, the channel region 100 is reversed from the p-type to the n-type, so that a channel is formed. Electrons are implanted from the emitter electrode 90 to the drift region 20 via the formed channel. By the implanted electrons, a forward bias is applied between the collector region 10 and the drift region 20, and holes are moved in order of the drift region 20 and the base region 30 from the collector electrode 80 via the collector region 10. When the current is then increased, the holes from the collector region 10 are increased and are accumulated below the base region 30. As a result, an on-voltage is lowered by conductivity modulation.

When the semiconductor device 1 is shifted from an on-state to an off-state, the gate voltage is lowered below a threshold voltage, for example, the gate voltage is controlled to be the same potential as the emitter voltage or to be a negative potential, thereby clearing off the channel region 100. Thereby, the implantation of the electrons from the emitter electrode 90 to the drift region 20 is stopped. Since the potential of the collector electrode 80 is higher than that of the emitter electrode 90, a depletion layer spreads from an interface between the base region 30 and the drift region 20, and then the holes accumulated in the drift region 20 gets through towards the emitter electrode 90.

At this time, the holes pass through between the recesses in which the gate electrodes 60 are formed. That is, an interval between the recesses functions as a discharge port of the holes.

Figure 2:
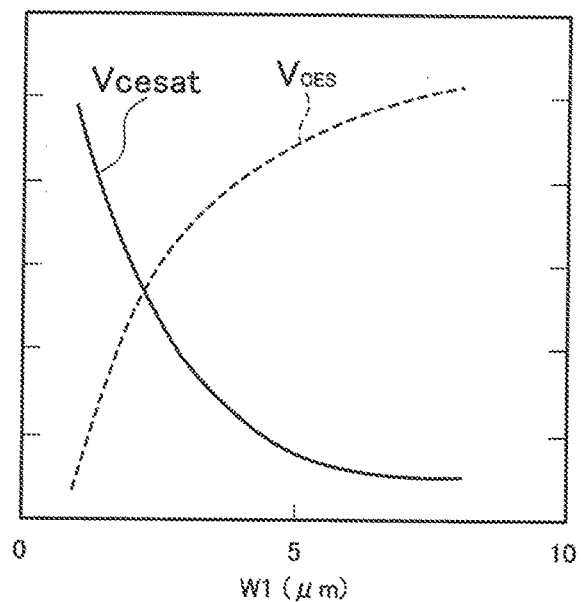
FIG. 2 is a graph illustrating a relation between a recess width and each of a collector-emitter voltage and a collector-emitter saturation voltage in the semiconductor device according to the illustrative embodiment of this disclosure.

FIG. 2 illustrates a relation between the width W1 of the recess, in which the gate electrode 60 is formed, and each of a collector-emitter withstand voltage $V_{CES}$ and a collector-emitter saturation voltage $V_{cesat}$ upon shorting between the gate and the emitter. The collector-emitter saturation voltage $V_{cesat}$ corresponds to an on-voltage. In the meantime, the width (the interval W2) of a part of the base region 30 abutting on the emitter electrode 90 constant. It is preferable that the collector-emitter saturation voltage $V_{cesat}$ is lower and the collector-emitter withstand voltage $V_{CES}$ is higher. It can be seen from FIG. 2 that when the recess width W1 is increased, the on-voltage is lowered. The reason is as follows.

When a predetermined collector voltage is applied between the emitter electrode 90 and the collector electrode 80 and a predetermined gate voltage is applied between emitter electrode 90 and the gate electrode 60 to turn on the semiconductor device 1, the channel region 100 is reversed from the p-type to the n-type and thus a channel is formed. The electrons that pass through the formed channel and have moved mainly along the side faces of the recesses from the emitter electrode 90 are implanted into the drift region 20. According to the implanted electrons, a forward bias is applied between the collector region 10 and the drift region 20, and the holes are moved from the collector region 10 to the drift region 20. In the meantime, a thickness of the drift region 20 below the recess bottom is about 30 µm to 180 µm, which is sufficiently wider than the recess width W1. For this reason, even when the recess width W1 is widened, the electrons moving along the recess are diffused into the drift region 20 in a region deeper than the recess. Thereby, the forward bias is applied to not only an interface between the collector region 10 and the drift region 20 just below the region between the recesses and also the interface between the collector region 10 and the drift region 20 in a wider range, and thus the holes are moved from the collector region 10 to the drift region 20.

The holes moving from the collector region 10 are suppressed from moving by the recess bottom and are accumulated in the drift region 20 in the vicinity of the recess bottom, so that conductivity modulation occurs. As the recess width W1 is wider, the holes are more easily accumulated in the drift region 20 in the vicinity of the recess bottom. Hence the semiconductor device 1 having the wider recess width W1 can lower the on-voltage without arranging a carrier accumulation layer. From FIG. 2, when the recess width is about 7 µm, the on-voltage is most effectively reduced. In the meantime, according to a semiconductor device of the related art, the recess width W1 is about 1 µm to 2 µm at the largest.

Also, the width (the interval W2) of the base region 30 abutting on the emitter electrode 90 is a length of a part becoming a window through which the holes move to the base region 30 and the emitter electrode 90. Since the interval W2 is sufficiently narrower than the width W1, an amount of the holes moving to the emitter electrode 90 is reduced and the holes are accumulated in the drift region 20 in the vicinity of the recess bottom.

Figure 3A:
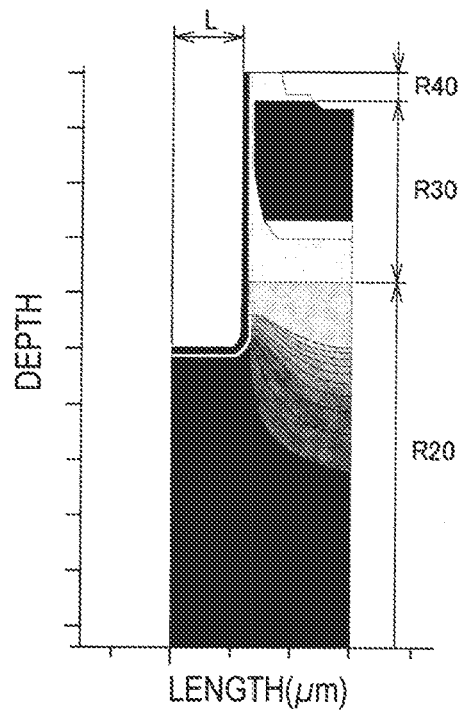
FIG. 3A illustrates a case where the recess width is 2 μm and FIG. 3B illustrates a case where the recess width is 1 μm.
Figure 3B:
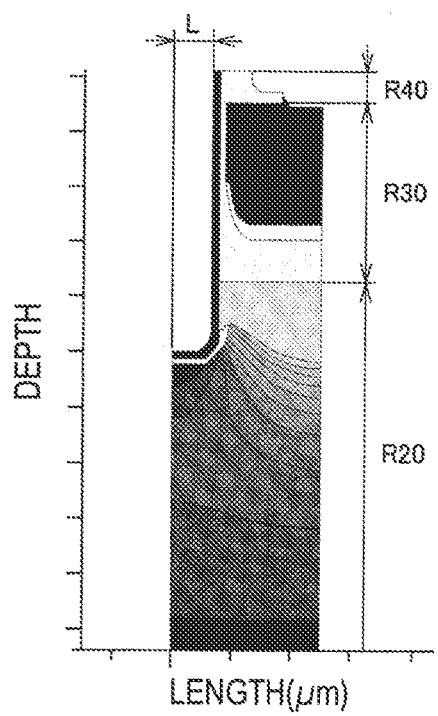

FIG. 3A illustrates a simulation result illustrating an aspect that the holes are accumulated when a length L of the recess bottom is 2 µm. For reference, FIG. 3B illustrates a simulation result when the recess bottom is narrower than FIG. 3A. That is, FIG. 3B illustrates a simulation result when the length L of the recess bottom is 1 µm. In FIGS. 3A and 3B, a horizontal axis indicates a length of an extension direction of the recess bottom, and a vertical axis indicates a depth from a surface (an opening) of the recess. In the meantime, a region R20 indicates a position of the drift region 20, a region R30 indicates a position of the base region 30 and a region R40 indicates a position of the emitter region 40. The higher a density of the accumulated holes, a corresponding region is shown to be darker. That is, the holes are accumulated in the drift region in the vicinity of the recess bottom. In particular, the holes are accumulated in a region below the recess bottom. As the holes are accumulated, the on-voltage is lowered by the conductivity modulation. However, as shown in FIGS. 3A and 3B, when the length of the recess bottom is 2 µm, the density of the holes accumulated below the outer side of the recess bottom is higher, as compared to the case where the length of the recess bottom is 1 µm. Therefore, the on-voltage is lower when the recess width W1 is wider.

In the meantime, when the interval W2 is wide, an amount of the holes that move to the base region 30 without being accumulated below the base region 30 is increased or a chip area is increased. Therefore, it is preferable that the recess width W1 is larger than the interval W2 to lower the on-voltage.

Also, as shown in FIG. 2, when the recess width W1 is widened, a withstand voltage of the semiconductor device 1 can be increased. The reason is as follows.

When the semiconductor device 1 is shifted from an on-state to an off-state, the depletion layer spreads into the drift region 20 not only from a PN junction interface-side with the base region 30 but also from the vicinity of the bottom of the recess in which the gate electrode 60 is formed. At this time, it is preferable that the depletion layer is uniformly spread and is spread more widely. If the depletion layer is non-uniformly spread or is spread in a narrow range, the withstand voltage is lowered. When the recess width W1 is narrow, both end portions of the recess bottom, which are electric field concentration points, are close to each other, so that the depletion layer is not spread widely with being favorably uniform just below the recess bottom. In contrast, when the recess width W1 is wide, end portions of the recess bottom are spaced, so that the depletion layer is spread more uniformly and more widely just below the recess bottom between the end portions. For this reason, the withstand voltage is improved in the semiconductor device 1 having the wide recess width W1.

Figure 4A:
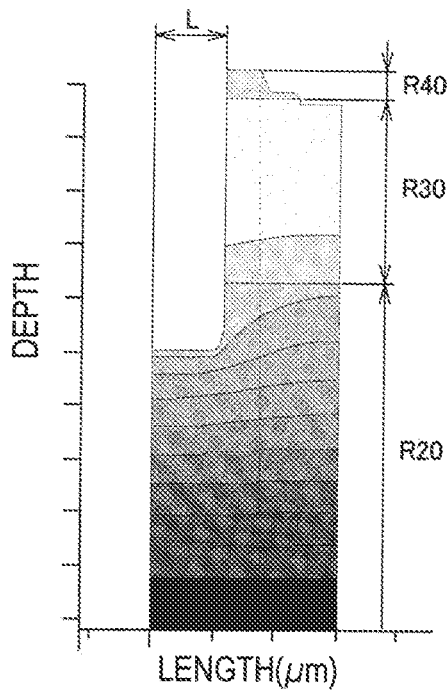
FIG. 4A illustrates a case where the recess width is 2 μm and FIG. 4B illustrates a case where the recess width is 1 μm.
Figure 4B:
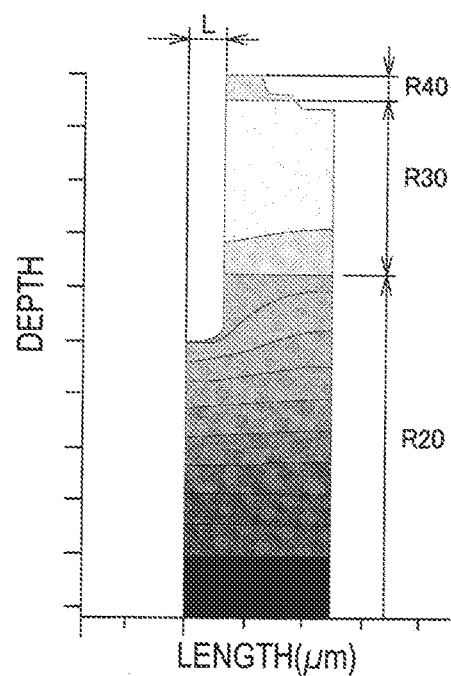

Simulation results of a potential distribution are shown in FIGS. 4A and 4B. FIG. 4A illustrates a simulation result when the length L of the recess bottom is 2 μm, and FIG. 4B illustrates a simulation result when the length L of the recess bottom is 1 μm. In FIGS. 4A and 4B, a horizontal axis indicates a length of an extension direction of the recess bottom and a vertical axis indicates a depth from a face of the recess. In the meantime, a region R20 indicates a position of the drift region 20, a region R30 indicates a position of the base region 30 and a region R40 indicates a position of the emitter region 40. The higher a potential, a corresponding region is shown to be darker. From FIGS. 4A and 4B, the depletion layer is downwards spread just below the recess. In particular, it is confirmed from the simulations that when the length of the recess is long, the potential distribution below the recess is wide and flat and the electric field is difficult to be concentrated.

Since the interval W2 is relatively narrow, the withstand voltage of the semiconductor device 1 is improved. A depth of the depletion layer between the recesses is shallower than that of the depletion layer just below the recess. As the interval W2 is wider, the interval between the recesses is also widened and the depletion layer spreading from the PN junction with the base region 30 in the region between the recesses is flatter. Hence, the depletion layer of the recess bottom is more strained at a part continuing to the depletion layer that spreads from the sides of the recess. Thereby, the electric field is concentrated on the vicinity of the end portions of the recess bottom, at which the depletion layer is strained, so that the withstand voltage is lowered. For this reason, it is preferable that the interval W2 is somewhat narrow, and the interval W2 is made to be equal to or less than the recess width W1.

Figure 5:
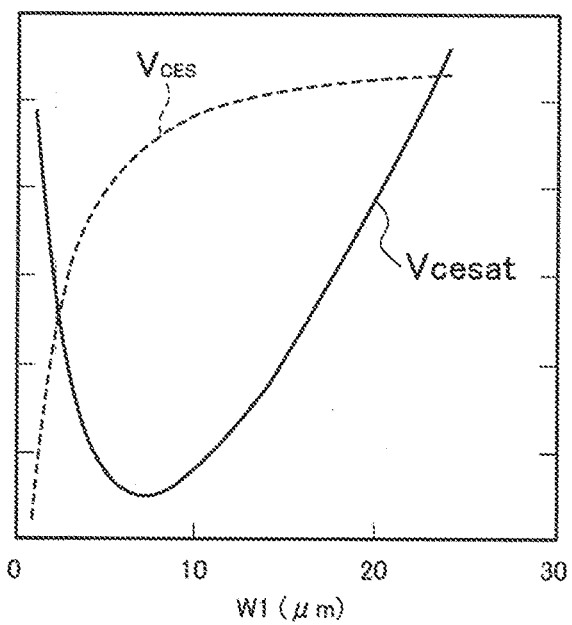
FIG. 5 is another graph illustrating a relation between a recess width and each of a collector-emitter voltage and a collector-emitter saturation voltage in the semiconductor device according to the illustrative embodiment of this disclosure.

In the meantime, the chip area has a limit. Therefore, when a chip size is made to be constant, if the recess width W1 is made to be wide, the number of channels is reduced. For example, when the width W1 exceeds six times of the interval W2, the effect of the on-voltage increase by the reduction in the number of channels is increased, as compared to the effect of the on-voltage lowering by the conductivity modulation resulting from the accumulation of the holes, so that the on-voltage of the semiconductor device 1 is increased. That is, as shown in FIG. 5, as the recess width W1 is wider a ratio of the channel area 100 occupying the chip size of the semiconductor device is decreased, so that the collector-emitter saturation voltage $V_{cesat}$ is increased. Therefore, it is preferable that the recess width W1 formed in the semiconductor device 1 is about 3 μm to 20 μm.

Figure 6:
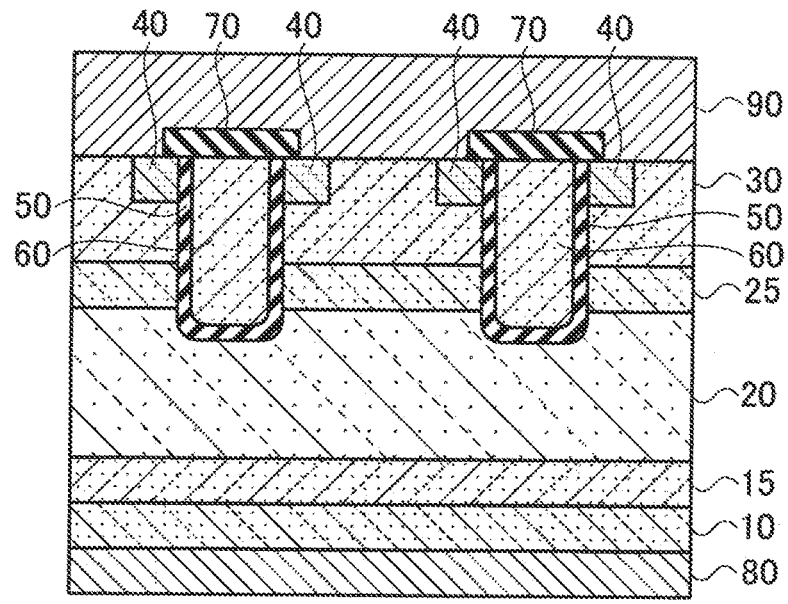
FIG. 6 is a schematic sectional view illustrating a structure of a semiconductor device according to a comparative example.

In comparison to the semiconductor device 1, it is not possible to sufficiently resolve the tradeoff of the withstand voltage and the on-voltage in a structure of a comparative example where a carrier accumulation layer 25 is arranged below the base region 30, as shown in FIG. 6, for example. The corresponding structure is preferable in that the on-voltage is lowered. However, an impurity concentration of the carrier accumulation layer 25 is increased to exceed an impurity concentration of the drift region 20, so that the depletion layer of the carrier accumulation layer 25 is difficult to spread and the withstand voltage is thus lowered. Like this, it is difficult to improve both the withstand voltage and the on-voltage just by arranging the carrier accumulation layer 25.

However, since the carrier accumulation layer is not formed in the semiconductor device 1 shown in FIG. 1, it is not necessary to consider the tradeoff relation of the withstand voltage and the on-voltage. Also, since it is not necessary to perform a process of forming the carrier accumulation layer, it is possible to suppress the number of manufacturing processes of the semiconductor device 1 from being increased. Also, the interval W2 is made to be narrow in the semiconductor device 1, so that it is possible to secure the sufficient withstand voltage.

Figure 7:
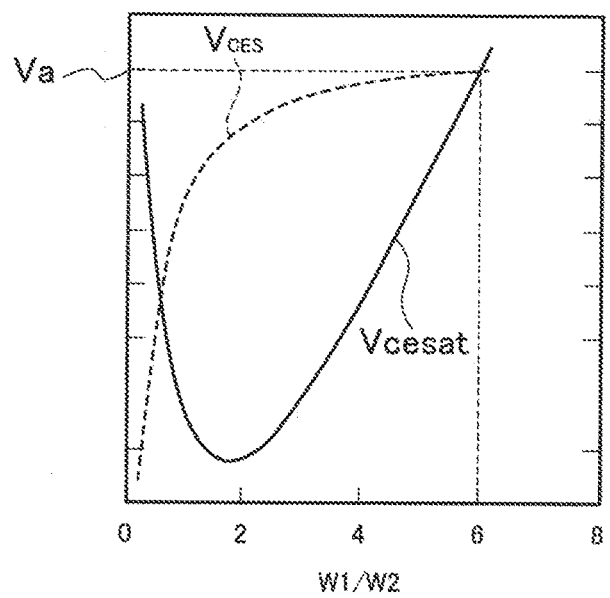
FIG. 7 is a graph illustrating a relation between a ratio of a recess width to a width of a base region abutting on an emitter electrode and each of a collector-emitter withstand voltage $V_{CES}$ and a collector-emitter saturation voltage $V_{cesat}$ in the semiconductor device according to the illustrative embodiment of this disclosure.

FIG. 7 illustrates a relation between a ratio W1/W2, which is a ratio of the recess width W1 to the interval W2, and each of the collector-emitter withstand voltage $V_{CES}$ and the collector-emitter saturation voltage $V_{cesat}$ upon the short between the gate and the emitter. As described above, the saturation voltage $V_{cesat}$ collector-emitter corresponds to the on-voltage. As shown in FIG. 7, the conventional saturation voltage $V_{cesat}$ collector-emitter, which is shown with a voltage value Va, is a value corresponding to the ratio W1/W2 (=6). In order to lower the on-voltage of the semiconductor device 1, the interval W2 and the recess width W1 preferably satisfy a following equation (1).

$$1 \leq W1/W2 \leq 6 \quad (1)$$

As shown with the equation (1), when the ratio W1/W2 of the recess width W1 to the interval W2 is made to be 1 or more and 6 or less, it is possible to reduce the on-voltage.

As described above, the interval W2 is required to have a somewhat area from standpoints of the on-voltage and the withstand voltage. When the ratio W1/W2 exceeds the upper limit of the relation shown with the equation (1), the total number of the channels is reduced, so that the on-voltage is increased. However, the recess width W1 is wider, as compared to the related art, so that it is possible to lower the on-voltage and to reduce the number of the recesses within the range in which the interval W2 and the recess width W1 satisfy the relation shown with the equation (1). Thereby, the total number of the channels is reduced and a parasitic capacity (Cge) between the gate electrode 60 and the semiconductor layer on the side face of the recess can be reduced.

Also, when the recess width W1 is widened and a cell pitch is widened, the total number of the channels is reduced and a channel resistance is increased. For this reason, the current flowing through the semiconductor device 1 is limited upon load short. That is, according to the semiconductor device 1, it is possible to secure a short tolerance dose.

The gate electrode 60 is composed of polysilicon, for example. The recess width W1 is wider, as compared to the related art, so that a gate resistance is reduced. Thereby, it is possible to realize a high-speed operation of the semiconductor device 1. Also, it is possible to realize the uniform device operation in the semiconductor device 1 even when many devices are arranged in the same chip.

In the meantime, in order to reduce the on-voltage of the semiconductor device 1, it is more preferable that the interval W2 and the recess width W1 satisfy a following equation (2).

$$1.5 \leq W1/W2 \leq 3 \quad (2)$$

It is further preferable that the interval W2 and the recess width W1 satisfy a following equation (3).

$$1.7 \leq W1/W2 \leq 2 \quad (3)$$

As shown in FIG. 7, when the interval W2 and the recess width W1 satisfy the equation (3), the on-voltage is minimized.

Figure 8:
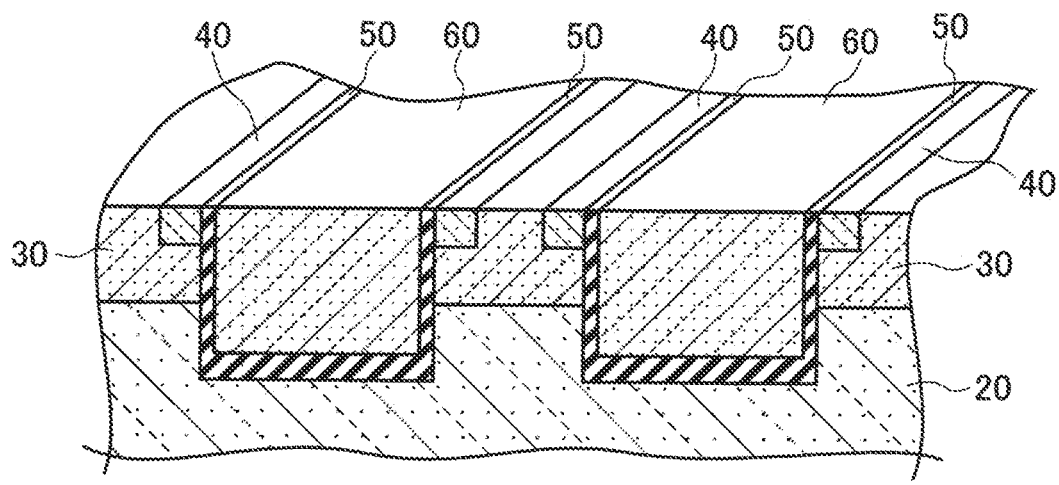
FIG. 8 is a schematic perspective view illustrating an arrangement example of an emitter electrode in the semiconductor device according to the illustrative embodiment of this disclosure.
Figure 9:
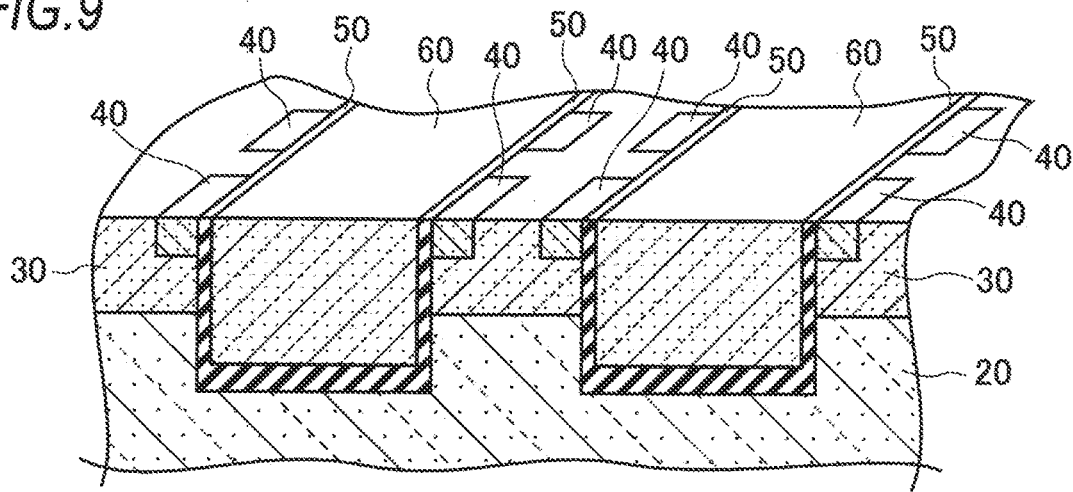
FIG. 9 is a schematic perspective view illustrating another arrangement example of an emitter electrode in the semiconductor device according to the illustrative embodiment of this disclosure.

In the meantime, the simulation results shown in FIGS. 3A and 4A and the relation of the ratio W1/W2 are obtained in a structure where the emitter region 40 is continuously formed along the recess, as shown in FIG. 8. However, as shown in FIG. 9, the emitter region 40 may be formed at intervals. For the structure shown in FIG. 9, a total area of the base region 30 abutting on the emitter electrode 90 substitutes for the interval W2 and a total area of the recesses facing the emitter electrode 90 at the interface between the drift region 20 and the base region 30 is the width W1, so that the above-described relation equation is obtained. That is, the relation of the ratio W1/W2 of the recess width W1 to the interval W2 is replaced with a ratio (hereinafter, referred to as an 'area ratio S') of the total area of the recesses at the same plane level as the interface between the drift region 20 and the base region 30 to the total area of a part of the base region 30 abutting on the emitter electrode 90. Therefore, the area ratio S is preferably 1 or more and 6 or less. Also, the area ration S is more preferably 1.5 or more and 3 or less, further preferably 1.7 or more and 2 or less.

In the meantime, the insulation film 50 is formed so that a thickness t1 arranged on the recess bottom is thicker than a thickness t2 arranged on the side face of the recess and facing the base region 30. In the semiconductor device 1, the width W1 of the recess in which the gate electrode 60 is formed is wide. Therefore, a parasitic capacity (Cgd) occurring between the gate electrode 60 of the recess bottom-side and the semiconductor region tends to increase. However, the thickness of the insulation film 50 on the recess bottom is made to be thicker, so that it is possible to reduce the parasitic capacity (Cgd).

The side of the insulation film 50 functions as a gate insulation film. Therefore, there is a limitation on the thickening of the insulation film 50. For this reason, it is preferably to thicken the film thickness of the bottom-side of the insulation film 50, as compared to the film thickness of the side of the insulation film 50. The thickness t1 of the insulation film 50 on the recess bottom is about 300 nm, for example, and the thickness t2 on the recess side is about 100 nm, for example.

As described above, in the semiconductor device 1 of this illustrative embodiment of this disclosure, the width W1 of the recess in which the gate electrode 60 is formed is made to be wide and the interval W2, which is a width of the base region 30 abutting on the emitter electrode 90 between the recesses, is set to be equal to or less than the recess width W1. For this reason, according to the semiconductor device 1 the holes are easily accumulated in the vicinity of the recess bottom. As a result, it is possible to provide a semiconductor device having a high withstand voltage/low on-voltage and capable of suppressing the increase in the number of manufacturing processes.

Figure 10:
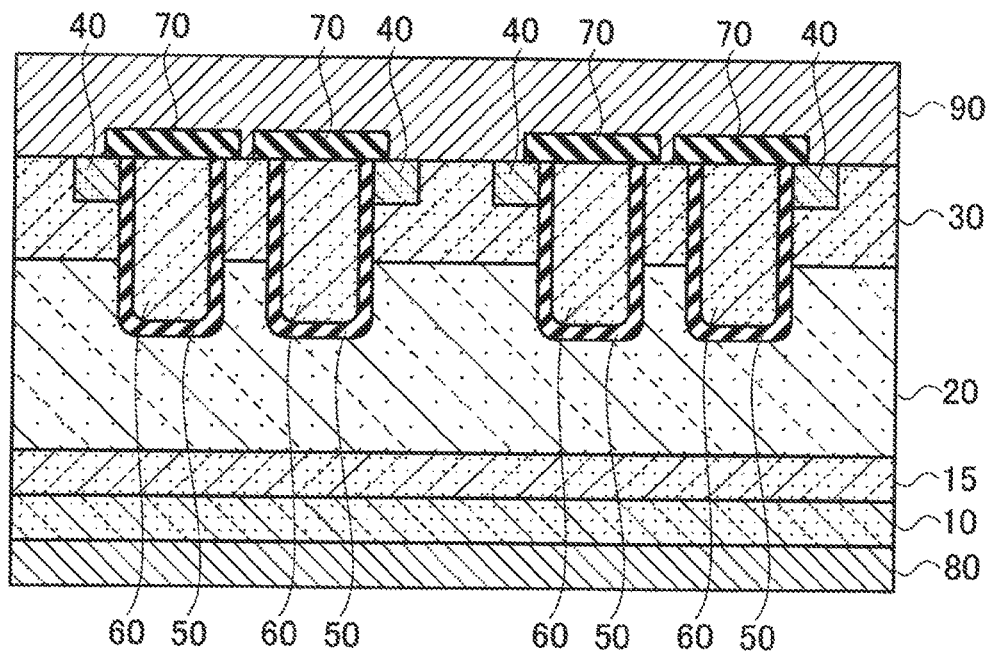
FIG. 10 is a schematic sectional view illustrating a structure of a semiconductor device according to another comparative example.

A method of substantially increasing a sectional area of the gate electrode to thus reduce a resistance (a gate resistance) of the gate electrode is considered by a structure different from the semiconductor device 1 shown in FIG. 1, for example, a structure where a plurality of recesses is formed in one cell. In a comparative example shown in FIG. 10, two recesses are formed in one cell. However, the number of recesses is increased, so that the parasitic capacity is increased.

In contrast, according to the semiconductor device 1, one recess is formed to resolve the problem that the parasitic capacity is increased. Also, since the recess width W1 is increased without forming a plurality of recesses, the gate resistance is reduced and the problem of the withstand voltage lowering is resolved.

A method of manufacturing the semiconductor device 1 according to the illustrative embodiment is described with reference to FIGS. 11 to 15. In the meantime, the manufacturing method that is described below is just exemplary and the semiconductor device can be implemented by a variety of manufacturing methods, including modified embodiments.

Figure 11:
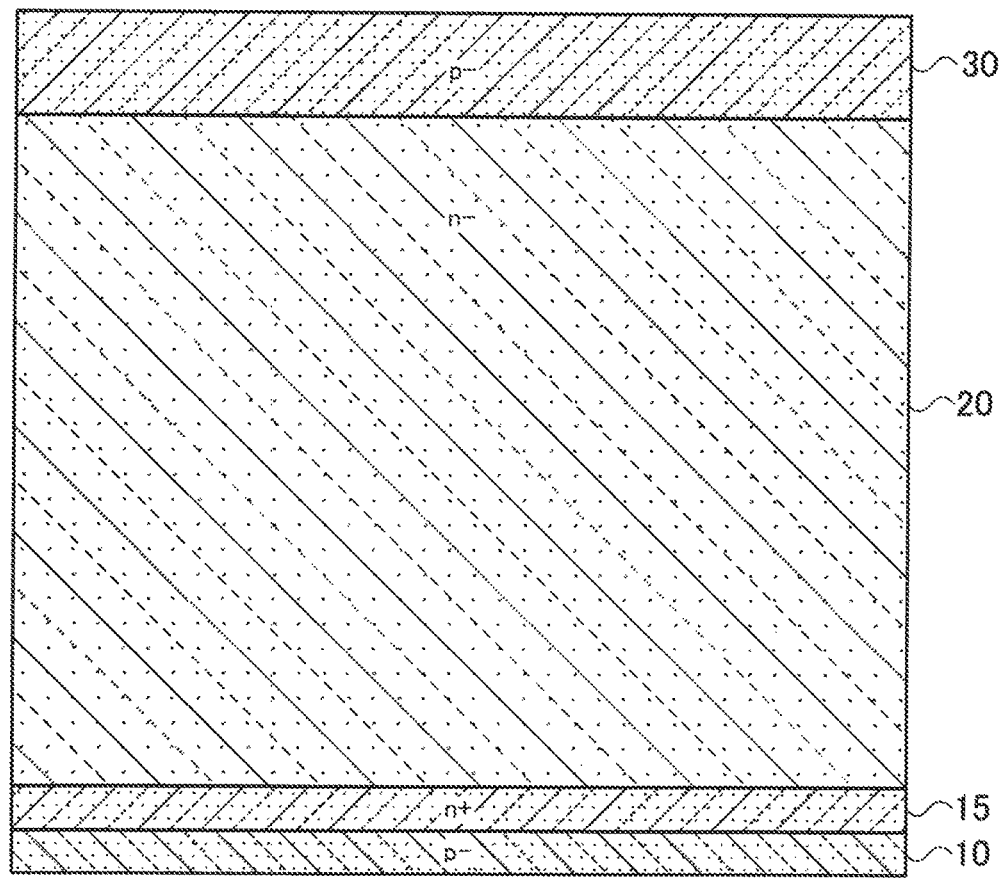
FIG. 11 is a schematic process sectional view illustrating a method of manufacturing a semiconductor device according to an illustrative embodiment (the process 1)
Figure 12:
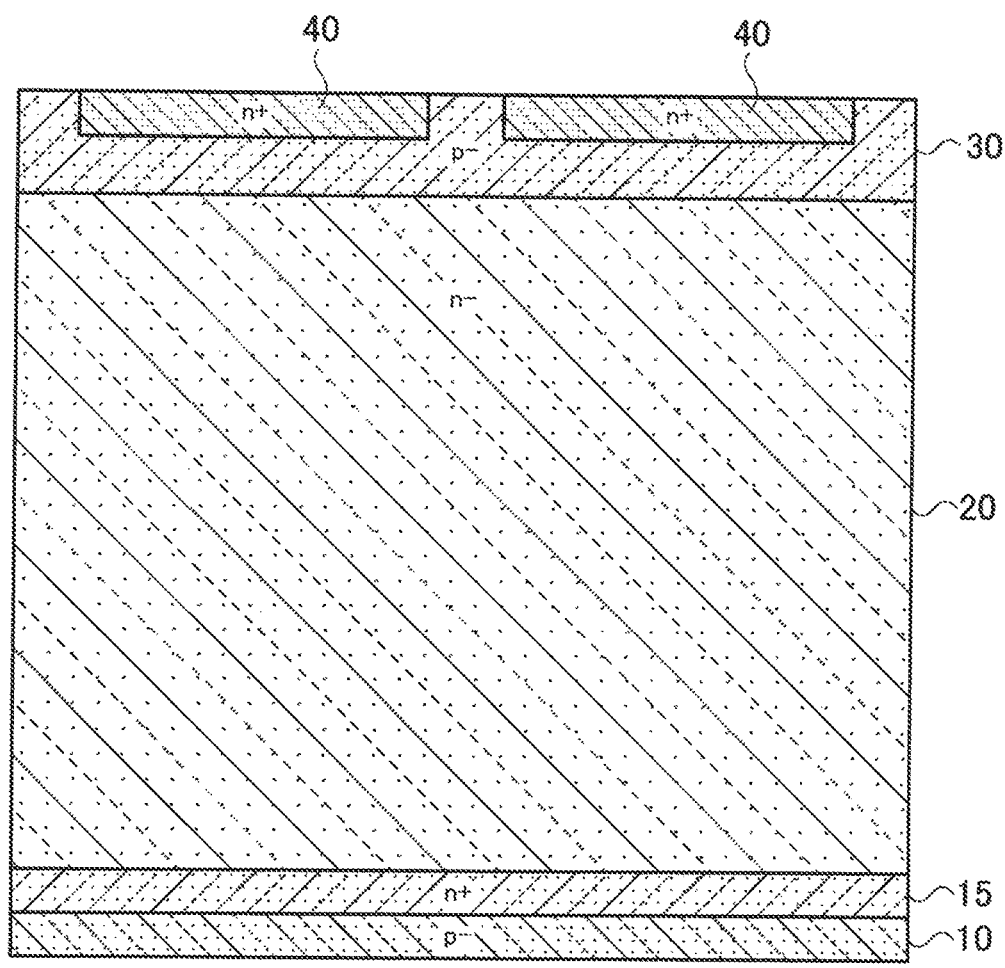
FIG. 12 is a schematic process sectional view illustrating the method of manufacturing a semiconductor device according the illustrative embodiment (the process 2)

As shown in FIG. 11, the p-type base region 30 is formed on the n⁻-type drift region 20, which is formed on a stacked body of the p⁻-type collector region 10 and the n⁺-type buffer layer 15, by an impurity diffusion method or epitaxial growth method. For example, according to the impurity diffusion method, p-type impurities are implanted into the drift region 20 from an upper face of the drift region 20 by an ion implantation method, and then they are diffused by annealing processing, so that the base region 30 is formed to have a substantially uniform thickness. The p-type impurities in the base region 30 are boron (B), for example. Then, as shown in FIG. 12, the n⁺-type emitter regions 40 are formed on a part of an upper face of the base region 30 by using the ion implantation method and diffusion, for example.

Figure 13:
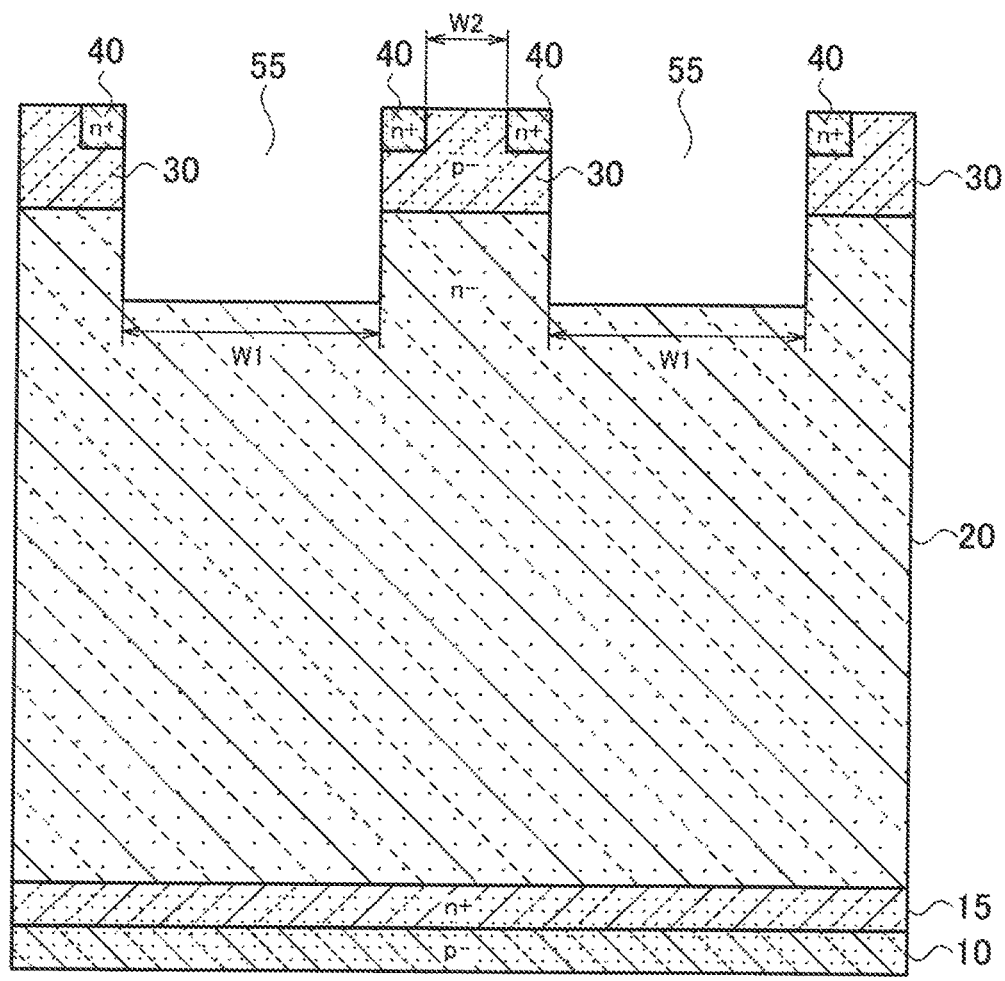
FIG. 13 is a schematic process sectional view illustrating the method of manufacturing a semiconductor device according to the illustrative embodiment (the process 3)

After that, as shown in FIG. 13, recesses 55, which extend from upper faces of the emitter regions 40 to pass through the emitter regions 40 and the base region 30 and have leading ends reaching the drift region 20, are formed by photolithography and etching techniques. A bottom of the recess 55 is substantially flat.

At this time, recesses 55 are formed so that the interval W2 is equal to or less than the width of the recess 55. As described above, the ratio W1/W2 of the width W1 of the recess 55 to the interval W2 is preferably 1 or more and 6 or less. In the meantime, the ratio W1/W2 is more preferably 1.5 or more and 3 or less, further preferably 1.7 or more and 2 or less.

Figure 14:
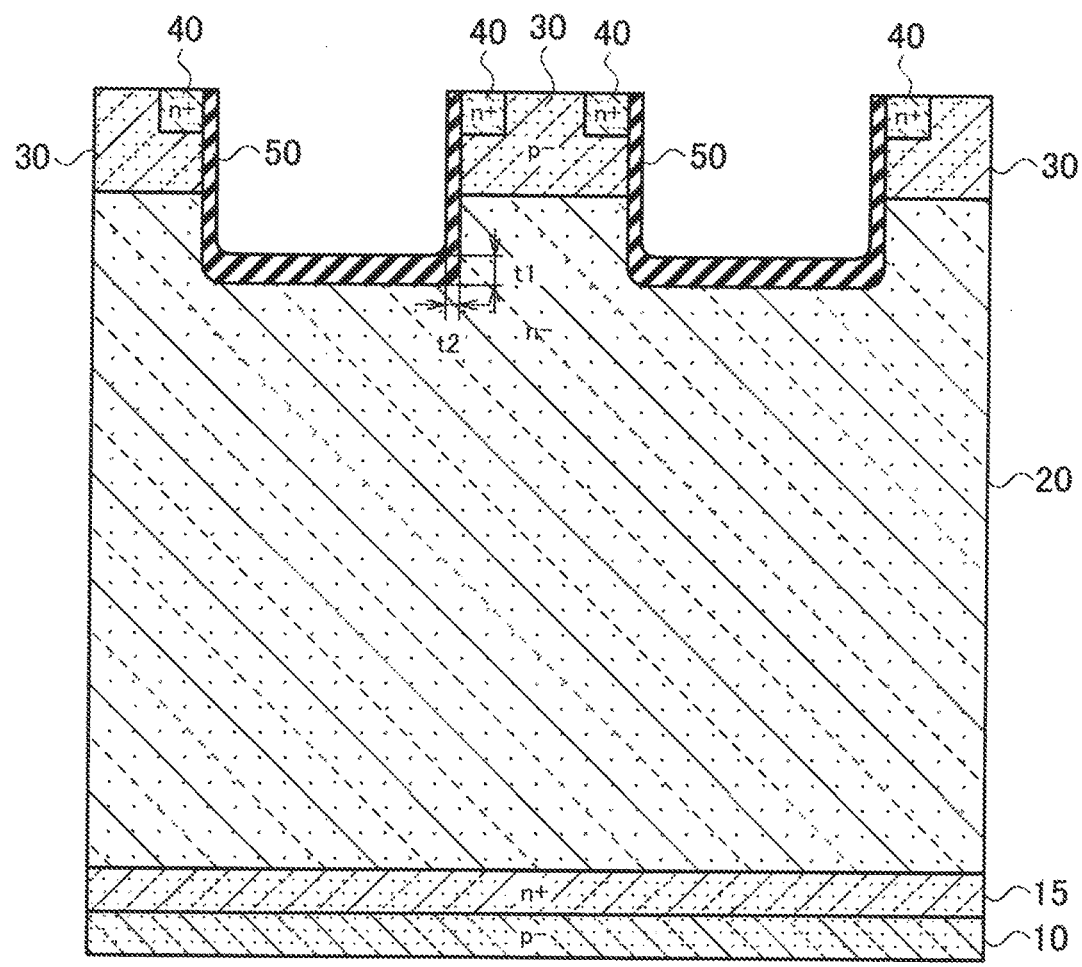
FIG. 14 is a schematic process sectional view illustrating the method of manufacturing a semiconductor device according to the illustrative embodiment (the process 4)

After that, as shown in FIG. 14, the insulation film 50 is formed on an inner wall of the recess 55. For example, a silicon oxide (SiO₇) film is formed by a thermal oxidation method. At this time, the insulation film 50 is formed so that a thickness t1 arranged on the bottom of the recess 55 is thicker than a thickness t2 of a region arranged on the side face of the recess 55.

Figure 15:
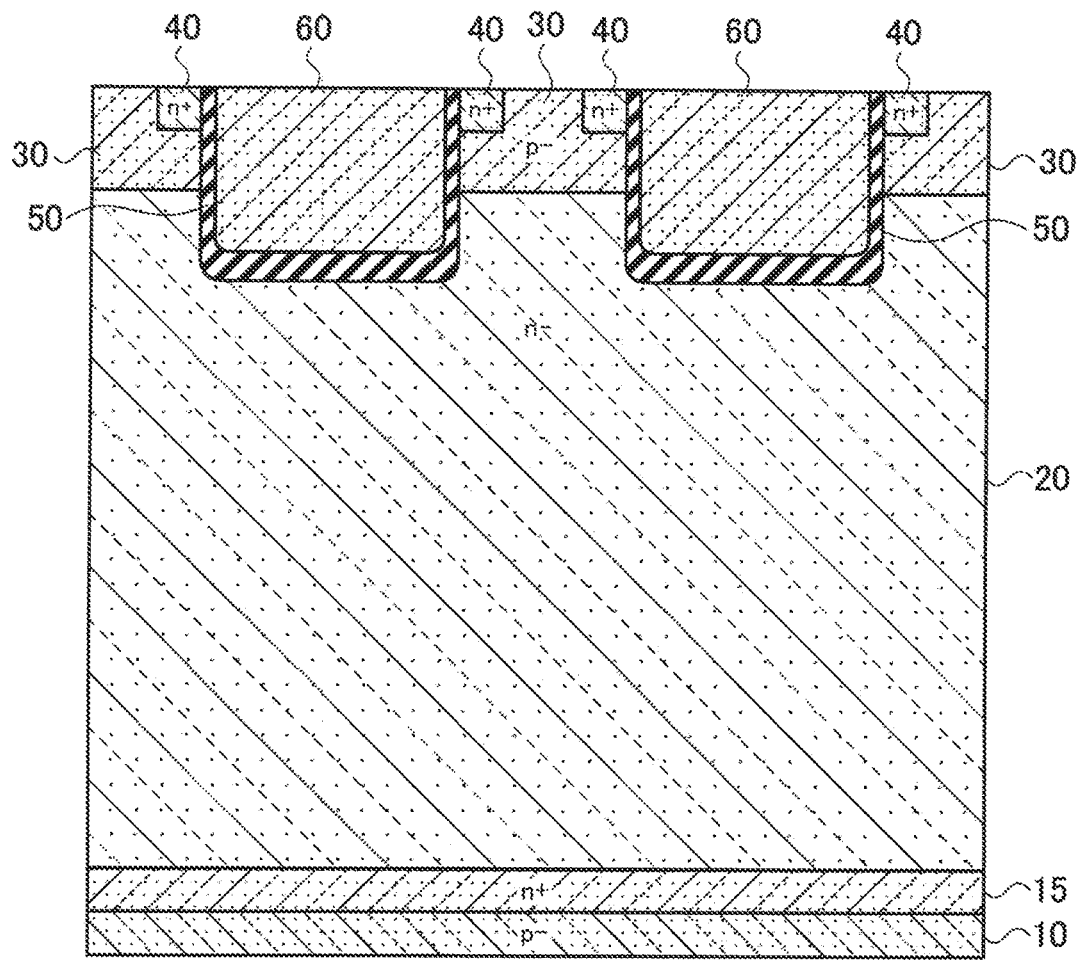
FIG. 15 is a schematic process sectional view illustrating the method of manufacturing a semiconductor device according the illustrative embodiment (the process 5)

Then, the gate electrodes 60 are formed. For example, a poly silicon film having impurities added thereto is embedded in the recesses, and then a polishing process such as chemical mechanical polishing (CMT) is performed to planarize a face of the base region 30, so that the gate electrodes 60 are formed, as shown in FIG. 15.

Also, the interlayer insulation film 70 is formed on the gate electrodes 60, and then the emitter electrode 90, which is connected to the emitter regions 40 and the base region 30, is formed on the interlayer insulation film 70. Also, the collector electrode 80 is formed on a backside of the collector region 10, so that the semiconductor device 1 shown in FIG. 1 is completed.

As described above, according to the method of manufacturing the semiconductor device 1 of the illustrative embodiment of this disclosure, the semiconductor device having the interval W2 equal to or less than the recess width W1 is manufactured. Therefore, it is possible to obtain the semiconductor device 1 in which the holes are easily accumulated in the vicinity of the recess bottom and which has the high withstand voltage/low on-voltage and suppresses the increase in the number of manufacturing processes.

Modified Embodiments

In the meantime, since the recess width W1 is wide in the semiconductor device 1, it is possible to easily embed a part or entirety of the lower part of the interlayer insulation film 70 in the recess formed on the upper face of the emitter region 40. Thus, at least a part of the interlayer insulation film 70 is preferably embedded in the recess in which the gate electrode 60 is formed. Thereby, the upper face of the emitter electrode 90 is suppressed from protruding from a region above the gate electrode 60 and is thus more planarized, as compared to the related art. As a result, it is possible to resolve a problem that is caused in a wire bonding process on the emitter electrode 90, and the like.

Figure 16:
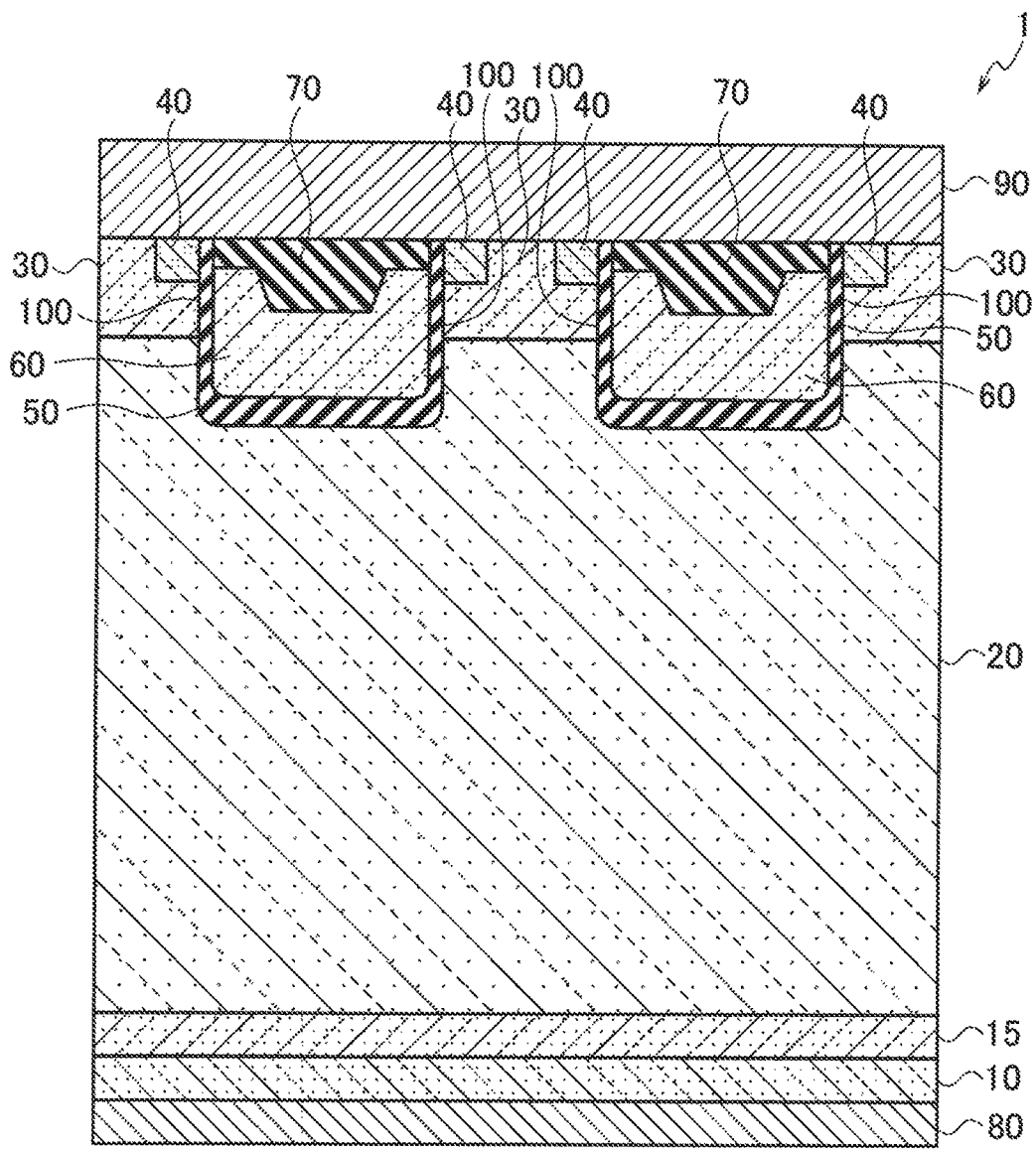
FIG. 16 is a schematic sectional view illustrating a structure of a semiconductor device according to a modified embodiment of the illustrative embodiment of this disclosure.
Figure 17:
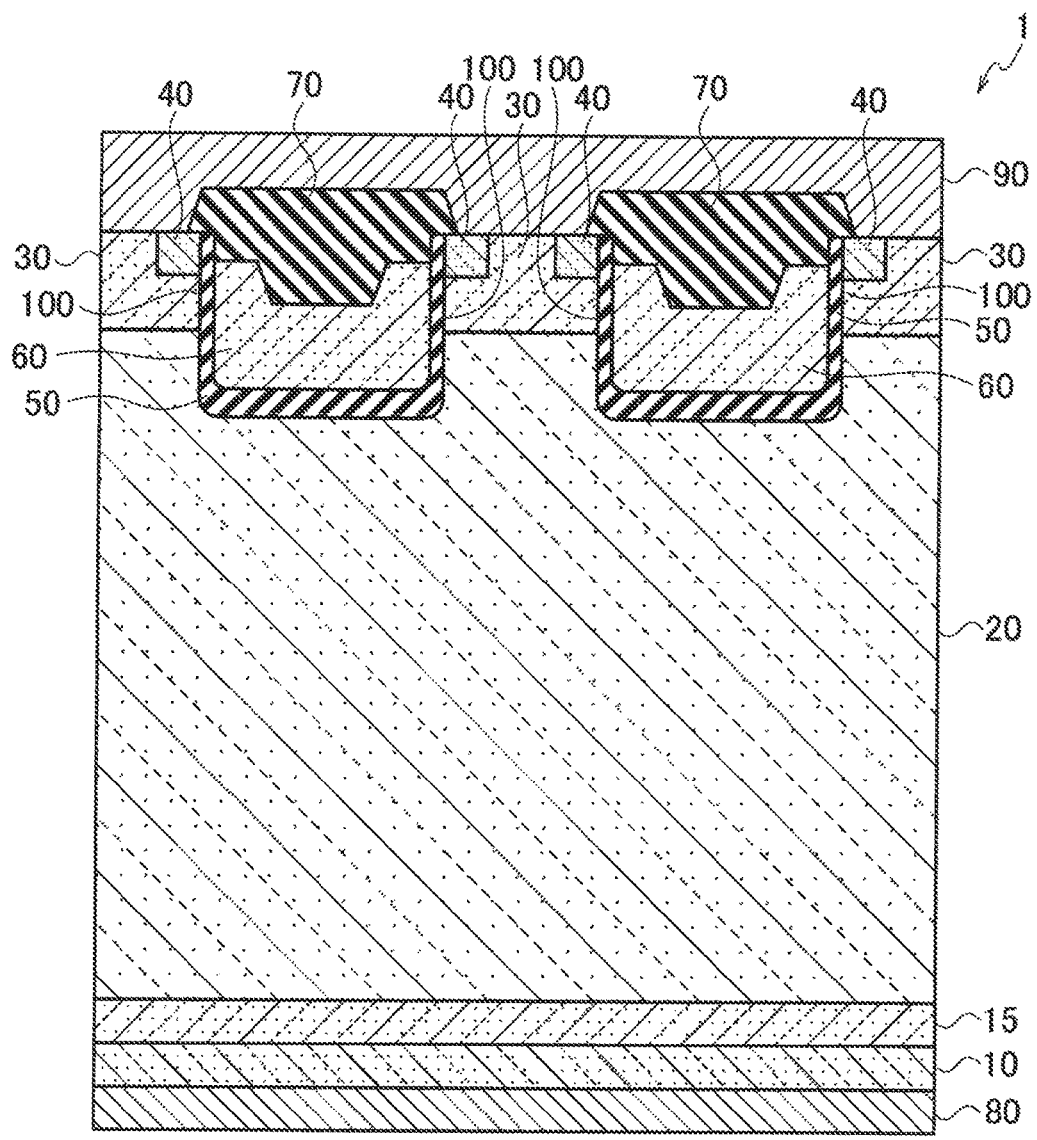
FIG. 17 is a schematic sectional view illustrating a structure of a semiconductor device according to another modified embodiment of the illustrative embodiment of this disclosure.

FIG. 16 illustrates an example where the interlayer insulation film 70 is entirely arranged in the recess. In the semiconductor device 1 shown in FIG. 16, the upper face of the interlayer insulation film 70 is flush with the upper face of the emitter region 40. In the meantime, the upper face of the interlayer insulation film 70 may be lower than the upper face of the emitter region 40. Alternatively, as shown in FIG. 17, a half or more of a thickness of the lower of the interlayer insulation film 70 may be arranged in the recess.

Other Illustrative Embodiments

Although this disclosure has been described with reference to the illustrative embodiments, the descriptions and drawings configuring the above clarified part are not construed to limit this disclosure. From the above descriptions, a variety of alternative embodiments, illustrative embodiments and applying technologies are apparent to one skilled in the art.

Figure 18:
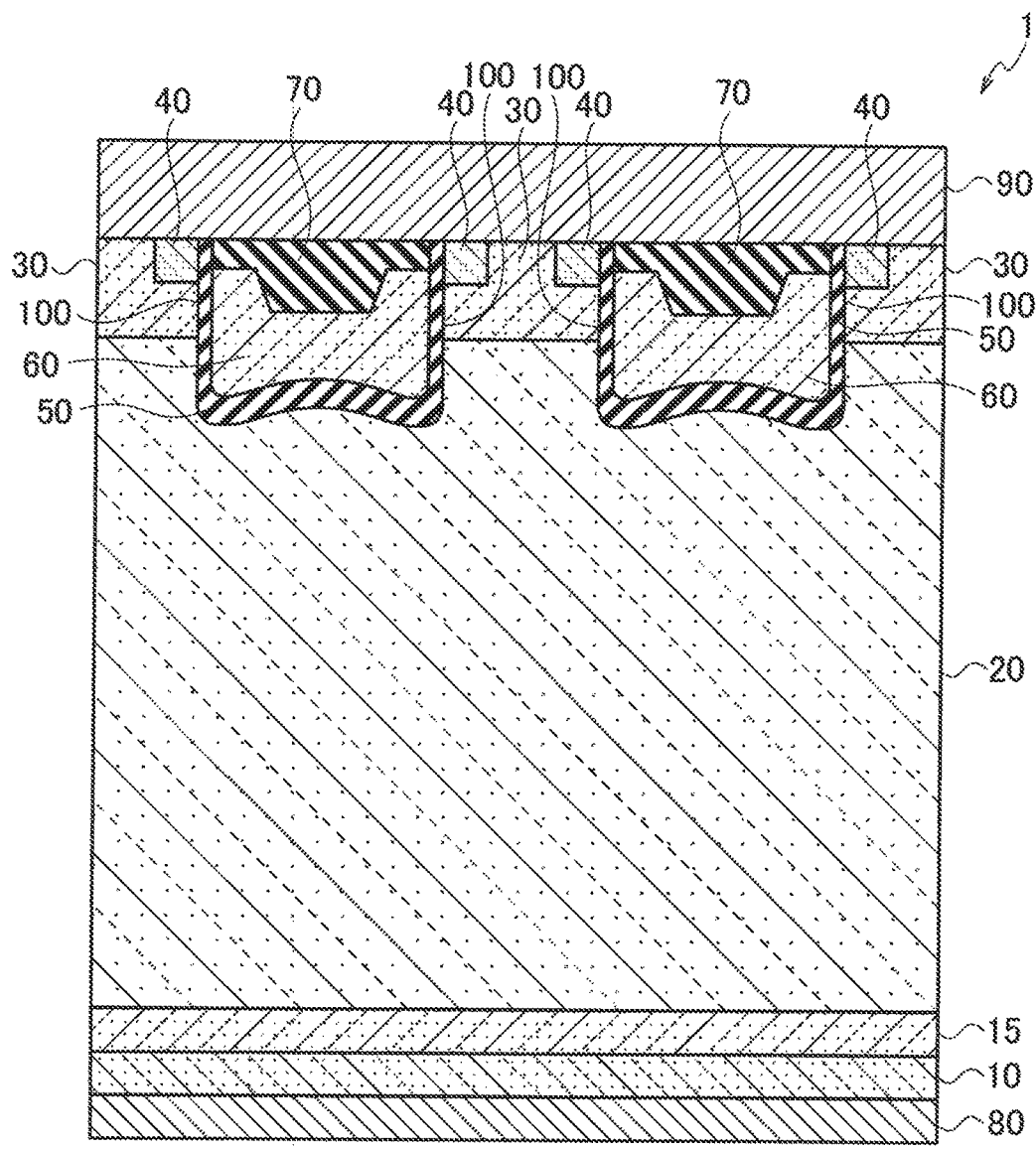
FIG. 18 is a schematic sectional view illustrating a structure of a semiconductor device according to another illustrative embodiment of this disclosure.

For example, as shown in FIG. 18, the recess bottom may be formed so that a central portion thereof is shallower than the end portions. The recess bottom is formed as such, so that it is possible to accumulate the holes in the central portion of the recess bottom more effectively. As a result, it is possible to lower the on-voltage.

Figure 19:
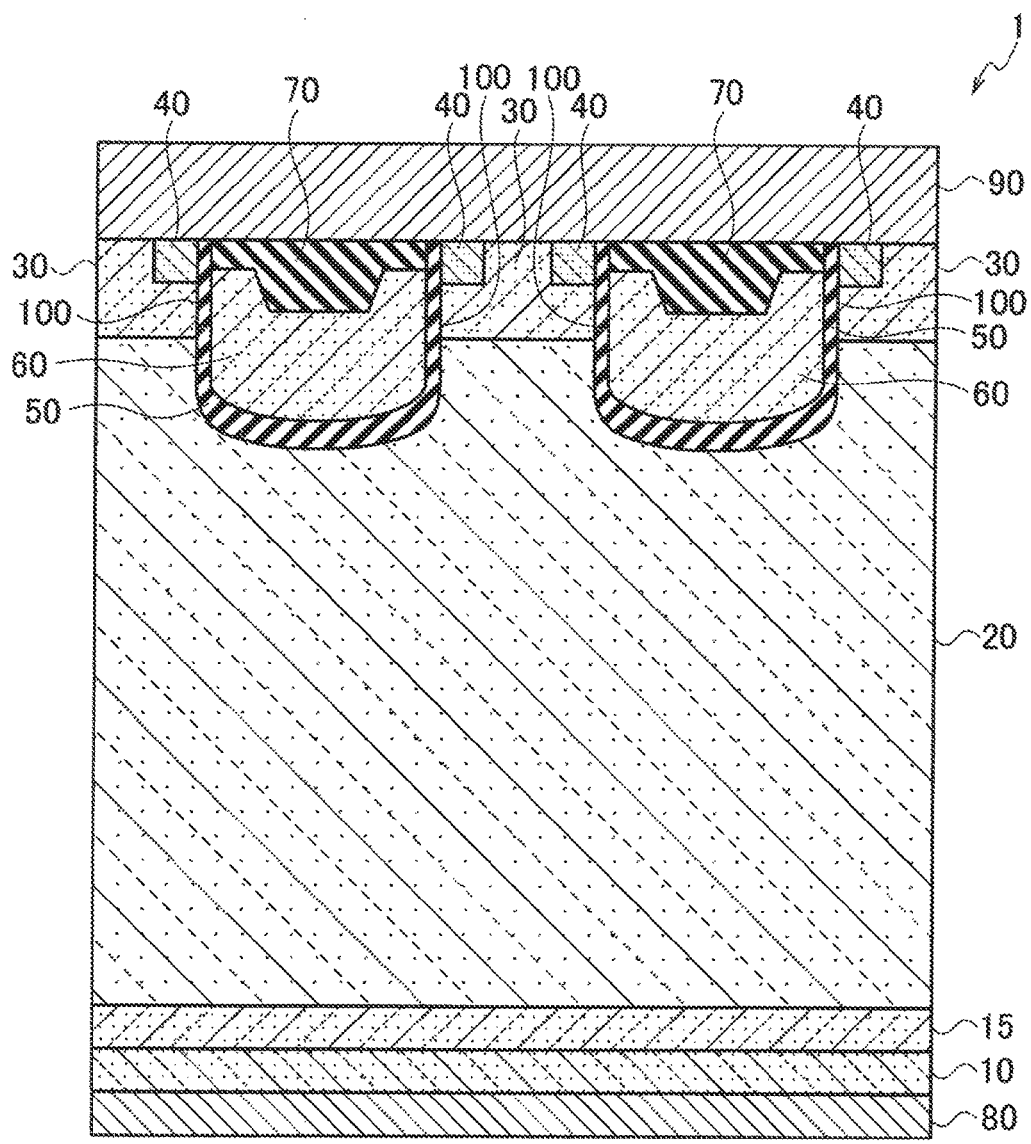
FIG. 19 is a schematic sectional view illustrating a structure of a semiconductor device according to still another illustrative embodiment of this disclosure.

Alternatively, as shown in FIG. 19, the recess bottom may be rounded so that at least a part of the recess bottom is downwards convex. When the end portions of the recess bottom are widely rounded, the holes are apt to move to the base region 30 without being accumulated below the recess. For this reason, when the recess bottom is formed to be flat or to be widely convex upwards, it is possible to lower the on-voltage.

Like this, this disclosure includes a variety of illustrative embodiments and the like that are described in this specification. Therefore, the technical scope of this disclosure is limited by the definitions of the claims, which are proper from the above descriptions.

What is claimed is:

1. A semiconductor device comprising:
a first semiconductor region, which has a first conductivity type;
a second semiconductor region, which has a second conductivity type and is arranged on the first semiconductor region;
a third semiconductor region, which has the first conductivity type and is arranged on the second semiconductor region;
a plurality of fourth semiconductor regions, each of which has the second conductivity type and is spaced from each other on the third semiconductor region;
an insulation film arranged on an inner wall of a recess, which extends from upper faces of the fourth semiconductor region to pass through the third semiconductor region and the fourth semiconductor region and reaches the second semiconductor region, wherein the insulation film faces a side face of the third semiconductor region, and wherein a width of the recess is in a range between 3 µm and 20 µm;
a control electrode, which is arranged on the insulation film in the recess;
a first main electrode, which is electrically connected to the first semiconductor region; and
a second main electrode, which is electrically connected to the third semiconductor region and the fourth semiconductor region,
wherein the semiconductor device comprises an insulated gate bipolar transistor in which holes moving from the first semiconductor region towards the third semiconductor region are accumulated in a vicinity of a bottom of the recess in the second semiconductor region by suppressing movement of the holes by the bottom of the recess, and
wherein a ratio of the width of the recess to a width of the third semiconductor region abutting on the second main electrode is 1 or more.

2. The semiconductor device according to claim 1, wherein the ratio is 1 or more and 6 or less.

3. The semiconductor device according to claim 1, wherein the ratio is 1.5 or more and 3 or less.

4. The semiconductor device according to claim 1, wherein the ratio is 1.7 or more and 2 or less.

5. The semiconductor device according to claim 1,
wherein the second main electrode is arranged above the control electrode,
wherein an interlayer insulation film is arranged between the control electrode and the second main electrode, and
wherein at least a part of the interlayer insulation film is embedded in the recess.

6. The semiconductor device according to claim 1, wherein a thickness of the insulation film arranged on a bottom of the recess is thicker than a thickness of the insulation film, which is arranged on a side face of the recess.

7. The semiconductor device according to claim 5, wherein the interlayer insulation film is entirely embedded in the recess.

8. A semiconductor device comprising:
a first semiconductor region, which has a first conductivity type;
a second semiconductor region, which has a second conductivity type and is arranged on the first semiconductor region;
a third semiconductor region, which has the first conductivity type and is arranged on the second semiconductor region;
a plurality of fourth semiconductor regions, each of which has the second conductivity type and is spaced from each other on the third semiconductor region;
an insulation film arranged on an inner wall of a recess, which extends from upper faces of the fourth semiconductor region to pass through the third semiconductor region and the fourth semiconductor region and reaches the second semiconductor region, wherein the insulation film faces a side face of the third semiconductor region, and wherein a width of the recess is in a range between 3 µm and 20 µm;
a control electrode, which is arranged on the insulation film in the recess;
a first main electrode, which is electrically connected to the first semiconductor region; and
a second main electrode, which is electrically connected to the third semiconductor region and the fourth semiconductor region,
wherein the semiconductor device comprises an insulated gate bipolar transistor in which holes moving from the first semiconductor region towards the third semiconductor region are accumulated in a vicinity of a bottom of the recess in the second semiconductor region in response to the bottom of the recess suppressing movement of the holes, and
wherein a ratio of a total area of the recess in a same plane level as an interface between the second semiconductor region and the third semiconductor region to a total area of a part of the third semiconductor region abutting on the second main electrode is 1 or more.

9. The semiconductor device according to claim 8, wherein the ratio is 1 or more and 6 or less.

10. The semiconductor device according to claim 8, wherein the ratio is 1.5 or more and 3 or less.

11. The semiconductor device according to claim 8, wherein the ratio is 1.7 or more and 2 or less.

12. The semiconductor device according to claim 8,
wherein the second main electrode is arranged above the control electrode,
wherein an interlayer insulation film is arranged between the control electrode and the second main electrode, and
wherein at least a part of the interlayer insulation film is embedded in the recess.

13. The semiconductor device according to claim 8, wherein a thickness of the insulation film arranged on a bottom of the recess is thicker than a thickness of the insulation film, which is arranged on a side face of the recess.

14. The semiconductor device according to claim 12, wherein the interlayer insulation film is entirely embedded in the recess.

\* \* \* \* \*